(12) United States Patent
Cheng

(10) Patent No.: US 7,574,771 B2
(45) Date of Patent: Aug. 18, 2009

(54) HIDEABLE HANDLE FOR AN INDUSTRIAL COMPUTER

(75) Inventor: Chi-Tsun Cheng, Taoyuan County (TW)

(73) Assignee: LIF J.K. Corporation, Dagancun Village Gueishan Township, Taoyuan County (TW)

( * ) Notice: Subject to any disclaimer, the term of this patent is extended or adjusted under 35 U.S.C. 154(b) by 481 days.

(21) Appl. No.: 11/449,882

(22) Filed: Jun. 9, 2006

(65) Prior Publication Data

US 2007/0283527 A1 Dec. 13, 2007

(51) Int. Cl.
*A45C 23/22* (2006.01)
*A45F 5/10* (2006.01)

(52) U.S. Cl. .......................... 16/114.1; 16/444; 16/405

(58) Field of Classification Search ................ 16/114.1, 16/405, 418, 438, 455; 43/54.1; 220/756–758, 220/761–763; 312/244, 223.1, 223.2, 332.1; 190/115, 39, 111, 117, 118; 206/743, 758, 206/315.11; 361/724–727, 798, 754, 801; 27/27, 2

See application file for complete search history.

(56) References Cited

U.S. PATENT DOCUMENTS

| 1,074,133 | A | * | 9/1913 | Neustaedter | 16/405 |
| 5,128,503 | A | * | 7/1992 | Frantz | 200/336 |
| 5,307,238 | A | * | 4/1994 | Marcus | 361/681 |
| 5,533,601 | A | * | 7/1996 | Wang | 190/115 |
| 5,553,355 | A | * | 9/1996 | Baty | 16/415 |
| 5,685,421 | A | * | 11/1997 | Gilmore | 206/216 |
| 5,845,978 | A | * | 12/1998 | Jung | 312/244 |
| 6,374,460 | B1 | * | 4/2002 | Edevold et al. | 16/422 |
| 6,389,645 | B1 | * | 5/2002 | Polidoro | 16/405 |
| 6,397,709 | B1 | * | 6/2002 | Wall | 81/440 |

FOREIGN PATENT DOCUMENTS

GB    2443844 A   *   5/2008

* cited by examiner

*Primary Examiner*—Chuck Y. Mah

(57) ABSTRACT

A hideable handle for an industrial computer which comprises a casing having a long hole; a frame installed in the long hole; the frame has a slot; the frame being assembled into the long hole of the casing; a handle unit rotatably installed in the slot of the frame by using a rotary shaft to pass through holes in the frame and the holes in the handle unit so that the handle unit can rotate along the rotary shaft; the handle unit having two cambered lateral sides and a flat bottom so that when the handle unit can be rotated along the rotary shaft in the slot of the frame. Furthermore, one of the two lateral sides of the handle unit is formed with a buckle. The flat bottom side of the handle unit has an indicia.

4 Claims, 5 Drawing Sheets

HIDEABLE HANDLE FOR AN INDUSTRIAL COMPUTER

FIELD OF THE INVENTION

The present invention relates to industrial computers, and in particular to a hideable handle for an industrial computer, wherein the handle is rotatable so as to be hidden in a casing to prevent from damage. When it is desired to use the handle, it is only necessary to rotate the handle along a predetermined direction so as to project out from the casing surface and thus the user can operate the handle easily and conveniently.

BACKGROUND OF THE INVENTION

Currently industrial computer has a cabinet for receiving the mainframe, keyboard, screen, hard disk. The cabinet has tracks. If it is necessary to use one device, it is pulled out by pulling a handle. Generally, the handle is protruded out from the casing surface to affect the operation of peoples passing therethrough. It is possible that the handle is damaged due to collision. Thereby the repairmen possible collide the handle as they lift their heads. Furthermore, currently, the devices in the computer cabinet are made more and more smaller and thus the distances between the handles are smaller, and thus it is possible when one handle unit is operated, the user's hand will be hurt by another handle. This defect is necessary to be improved.

SUMMARY OF THE INVENTION

Accordingly, the primary object of the present invention is to provide a hideable handle for an industrial computer, wherein the handle is rotatable to be hidden in the casing so as to prevent from damage. When it is desired to use the handle, it is only necessary to rotate the handle along a predetermined direction so as to project out from the casing surface and thus the user can operate the handle easily and conveniently.

To achieve above objects, the present invention provides a hideable handle for an industrial computer which comprises a casing having a long hole; a frame installed in the long hole; the frame has a slot; the frame being assembled into the long hole of the casing; a handle unit rotatably installed in the slot of the frame by using a rotary shaft to pass through holes in the frame and the holes in the handle unit so that the handle unit can rotate along the rotary shaft; the handle unit having two cambered lateral sides and a flat bottom so that when the handle unit can be rotated along the rotary shaft in the slot of the frame.

Furthermore, one of the two lateral sides of the handle unit is formed with a buckle capable of buckling an inner wall of the frame as the handle unit rotates in the slot.

The flat bottom side of the handle unit has an indicia. When the bottom of the handle unit faces outwards, the bottom will flush with an outer surface of the frame.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
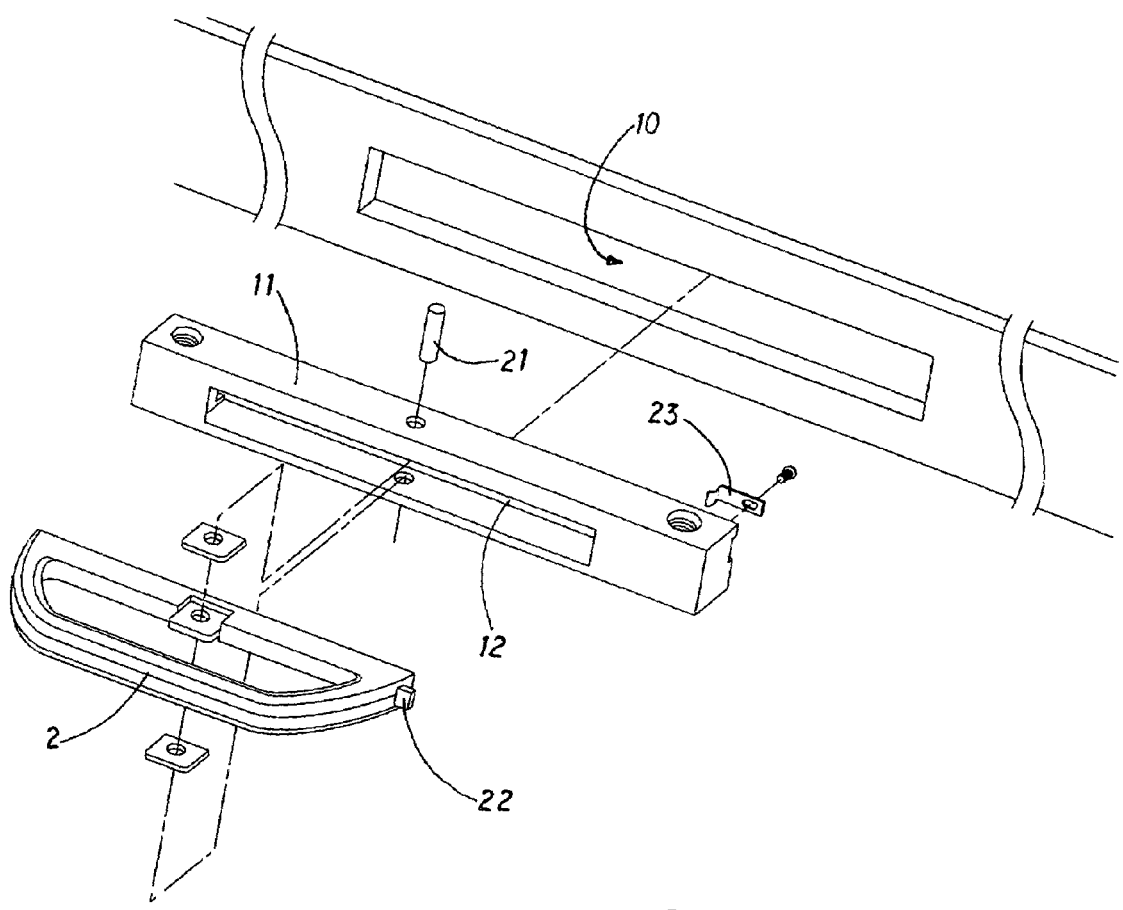
FIG. 1 shows a perspective view of the present invention.
Figure 2:
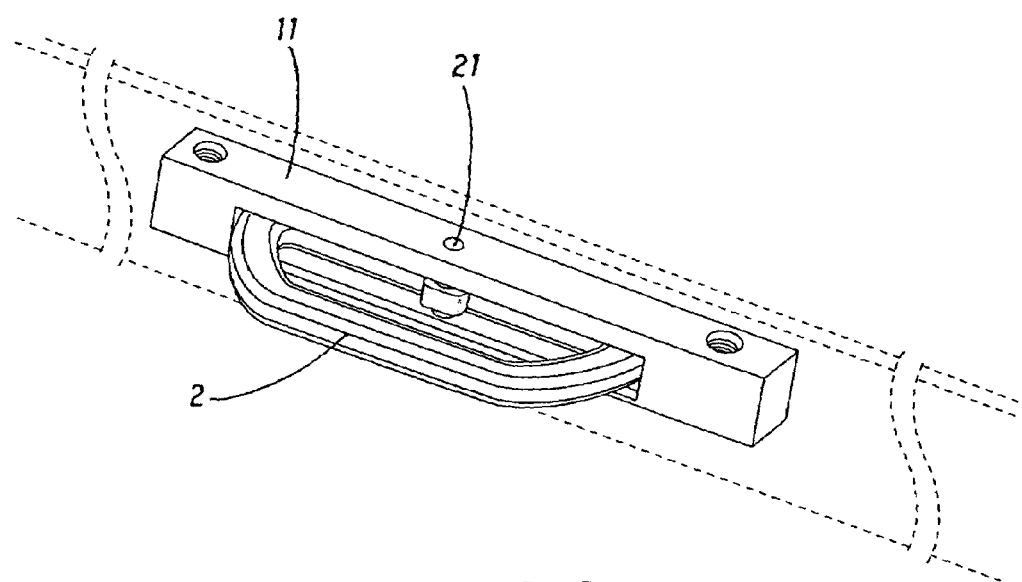
FIG. 2 is an assembled view of the present invention.
Figure 3:
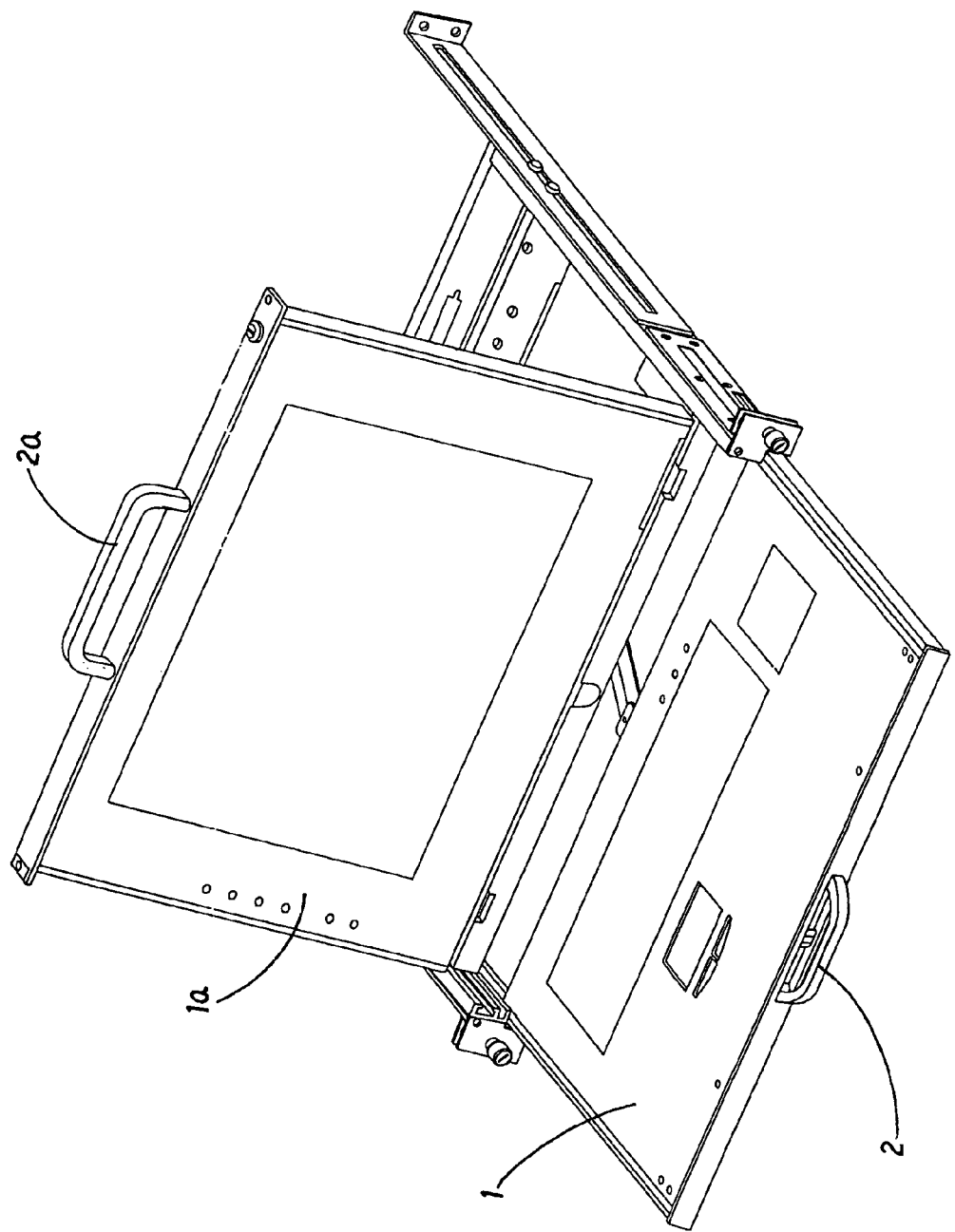
FIG. 3 shows the installation of the present invention, wherein the handle unit is not received.

Referring to FIGS. 1 to 3, a hiddleable handle with a hiddle structure comprises the following elements.

A casing 1 has a long hole 10. The casing 1 is for example a casing in the computer cabinet.

A frame 11 is installed in the long hole 10. The frame 11 has a slot 12. The frame 11 is assembled into the long hole 10 of the casing 1.

A handle unit 2 is rotatably installed in the slot 12 of the frame 11 by a rotary shaft 21 to pass through holes in the frame 11 and the holes in the handle unit 10 so that the handle unit 2 can rotate along the rotary shaft 21. The handle unit 2 has two cambered lateral sides and a flat bottom so that the handle unit 2 is rotateable along the rotary shaft 21 in the slot 12 of the frame 11 through 180 degrees. When the bottom of the handle unit 2 faces outwards, the bottom will flush with an outer surface of the frame 11.

Figure 2A:
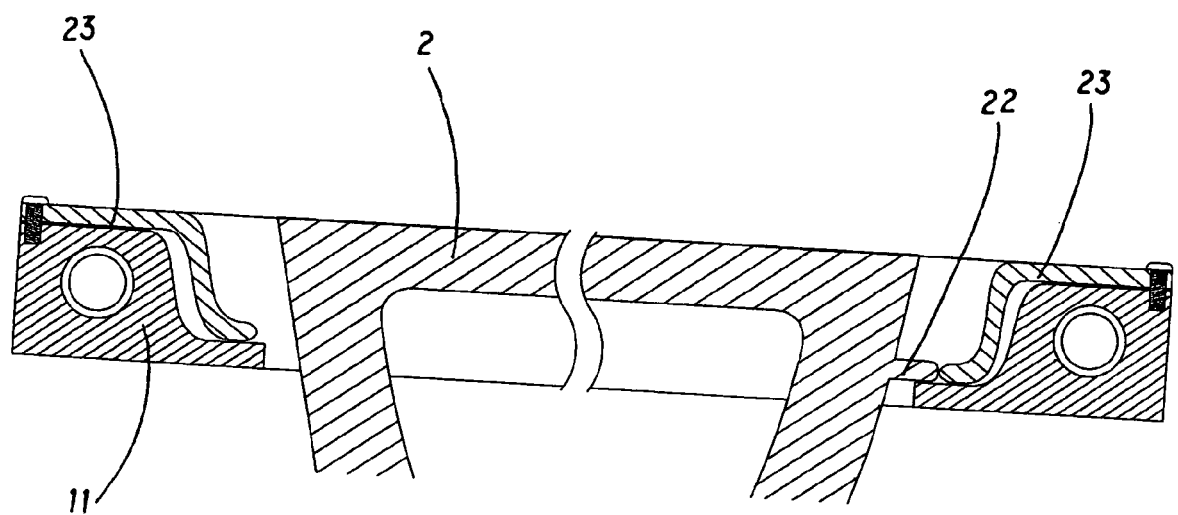
FIG. 2A is an assembled cross sectional view of the present invention.

One of the two lateral sides of the handle unit 2 is formed with a buckle 22 capable of buckling an inner wall of the frame 11 as the handle unit 2 rotates in the slot 12. Each of two ends of the frame 11 installed with a curved sheet 23 (see FIGS. 1 and 2A) by using a respective screw. After assembly, the buckle 22 will resist against one of the sheet 23 (see FIG. 2A) so as to confine the movement of the handle unit 2.

The flat bottom side of the handle unit 2 has an indicia 24.

Figure 4:
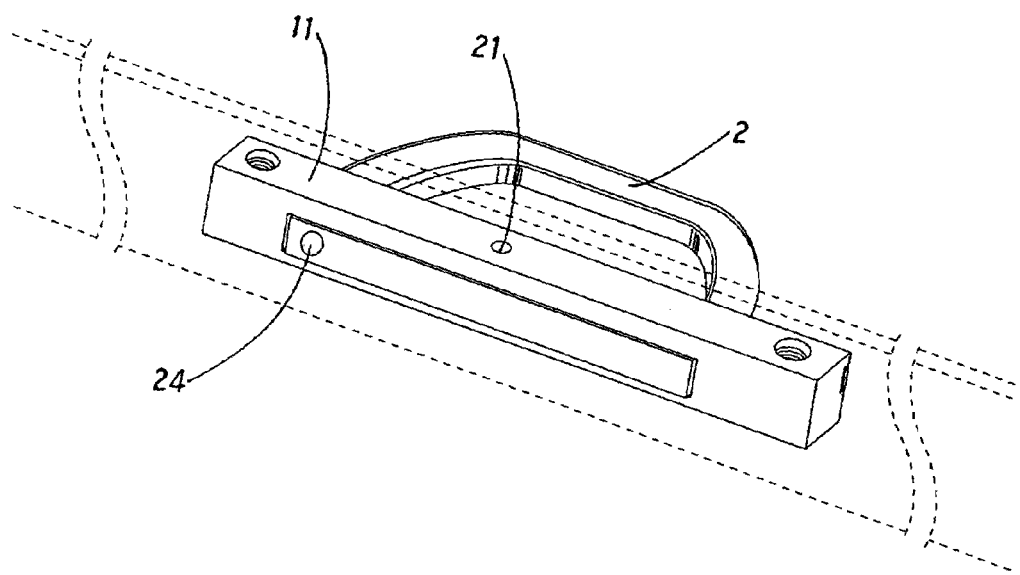
FIG. 4 is a schematic view showing the use of the present invention, wherein the handle unit is received in the slot.

When the handle unit 2 is pulled, the casing 1 can be pulled out. When the casing 1 is a computer cabinet, the user can press the indicia 24 to push the handle unit 2 to rotate along a predetermined direction. The handle unit 2 is hidden in the casing 1 (referring to FIGS. 2 and 4) so as to prevent from damage.

Figure 5:
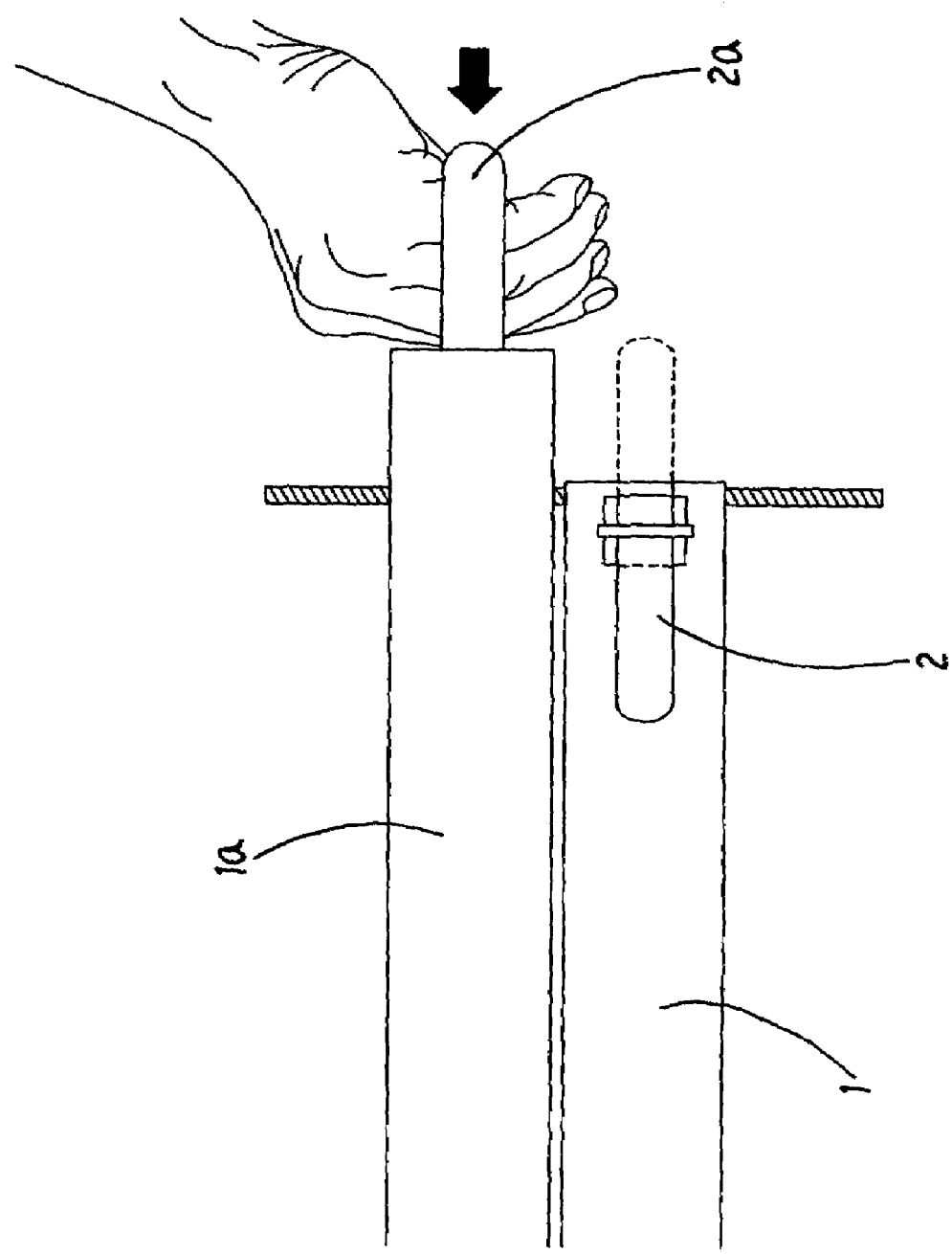
FIG. 5 is a plane view showing that the present invention is used to a computer cabinet.

Referring to FIGS. 3 and 5, the handle units 2, 2a are installed at a front side of casings 1, 1a of a computer cabinet (for example for carrying a keyboard and a liquid crystal display screen), normally, the handle units are received in the slots 12. When one handle unit 2a and one casing 1a are pushed inwards, the casing can be pushed into the hole easily without damaging the handle units.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A hideable handle for an industrial computer comprising;
   a casing having a long hole;
   a frame installed in the long hole; the frame having a slot; the frame being assembled into the long hole of the casing;
   a handle unit rotatably installed in the slot of the frame by using a rotary shaft to pass through holes in the frame and the holes in the handle unit so that the handle unit is rotatable along the rotary shaft; the handle unit having two cambered lateral sides and a flat bottom so that the handle unit can be rotated along the rotary shaft in the slot of the frame.

2. The hideable handle for an industrial computer as claimed in claim 1, wherein one of the two lateral sides of the handle unit is formed with a buckle capable of buckling an inner wall of the frame as the handle unit rotates in the slot.

3. The hideable handle for an industrial computer as claimed in claim 1, wherein the flat bottom side of the handle unit has an indicia.

4. The hideable handle for an industrial computer as claimed in claim 1, wherein when the bottom of the handle unit faces outwards, the bottom will flush with an outer surface of the frame.

* * * * *